Feb. 12, 1957 C. N. HOOD II 2,781,422

BAND-PASS FILTER CIRCUIT

Filed Jan. 7, 1953

Inventor:
Charles N. Hood II,
by Charles M. Hutchins
His Attorney.

United States Patent Office 2,781,422
Patented Feb. 12, 1957

2,781,422

BAND-PASS FILTER CIRCUIT

Charles N. Hood II, Auburn, N. Y., assignor to General Electric Company, a corporation of New York Application January 7, 1953, Serial No. 330,008
7 Claims. (Cl. 179—171)

The present invention relates to band-pass filter circuits having sharp frequency-selective characteristics and, more particularly, to electronic filters of this type employing the principle of frequency-selective amplification. The invention is of particular utility as applied to filter circuits designed to operate in the audio frequency ranges, namely, in the range from approximately 20 to 20,000 cycles per second.

It is often desirable in filter devices to have a high ratio of reactance to effective resistance, known as a high-Q factor. In general, conventional high-Q filter devices employ a plurality of filter units which may be of the inductive-capacitive variety arranged to attenuate unwanted frequencies from a given input wave. Such arrangements are often intricate and usually involve the inclusion of relatively expensive components to achieve satisfactory filtering action. Furthermore, the inherent resistance of the inductive units usually employed, particularly in the audio ranges, tends to reduce the effective Q of the filter device. Where a plurality of inductive-capacitive filter devices or the like are employed, it is also necessary to provide means for simultaneously tuning the various devices.

Filter devices have been devised which emphasize certain frequency components more than others. One well-known method of accomplishing this result is by means of frequency-selective degenerative feed-back, i. e., by applying to the input of an amplifying device a frequency-selective portion of its output wave in such manner as to oppose the corresponding frequency portion of the input wave simultaneously as it is applied to the device, thus causing a reduction in the output wave for the selected frequency portion. For effective degeneration, the degenerative wave is generally substantially 180° out of phase with the wave component to be reduced.

It is an object of the present invention to provide an electronic band-pass filter circuit having improved frequency-selective characteristics which employs a single inductive-capacitive filtering unit and which thus eliminates the necessity of cooperative tuning of a plurality of tuning units.

It is another object of the present invention to provide an improved high-Q electronic filter circuit which is comparatively simple and inexpensive to construct.

It is still another object of the present invention to provide an improved electronic filter having a high-Q in which amplification is provided for a selected frequency.

It is a still further object of the present invention to provide an improved electronic filter which is capable of adjustment to any one of the wide range frequencies by the adjustment of a single inductive-capacitive unit.

Briefly stated, in accordance with one aspect of the present invention, there is provided a filter circuit comprising first and second stages of amplification in cascade. Frequency selective means are also provided for deriving from the output system of the first stage a degenerative voltage in response to a predetermined frequency portion of an input wave applied to the input system of the first stage, and coupling means for applying said derived voltage in degenerative relation to the input systems of both stages.

For additional objects and advantages, and for a better understanding of the invention, attention is now directed to the following description and accompanying drawing. The features of the invention which are believed to be novel are particularly pointed out in the appended claims.

Figure 1:
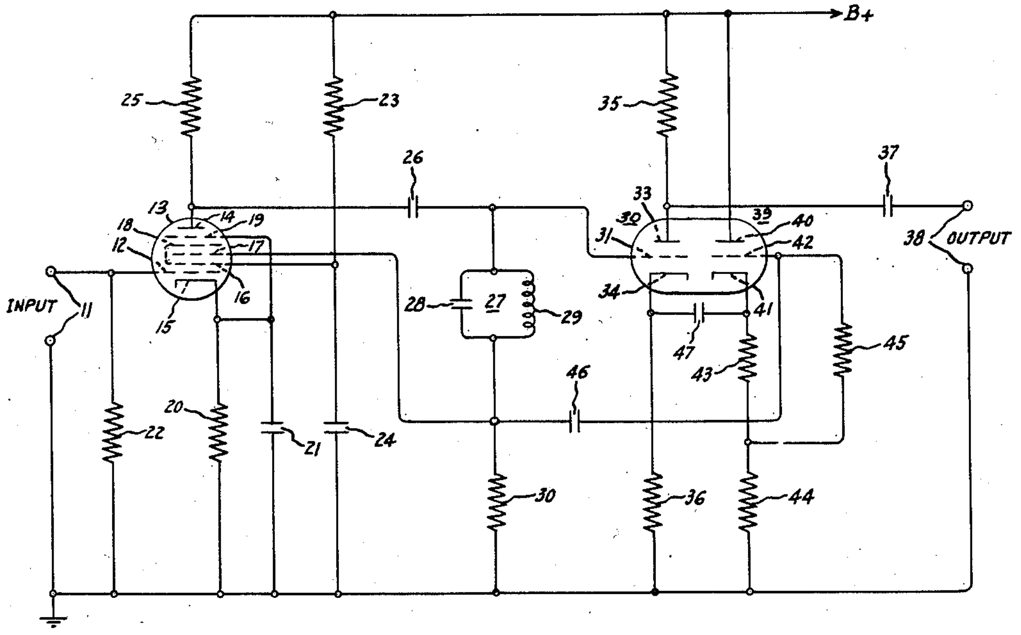
Figure 1 is a schematic circuit diagram of an electronic filter device constructed in accordance with the present invention.

Referring now to Fig. 1, there is shown a pair of input terminals 11, the first of which is connected to the control electrode 12 of a multi-grid electron discharge device 13. The second input terminal is connected to ground in conventional manner. Device 13, shown as a pentagrid type, comprises an anode 14, a cathode 15, the previously mentioned first control electrode 12, a first screen grid 16, a second control grid 17, a second screen grid 18, and a suppressor grid 19. The first and second screen grids are disposed one on either side of the second control grid and are interconnected within the device 13. The cathode 15 is connected through a cathode resistor 20 to the ground. A cathode bypass capacitor 21 is connected across the cathode resistor 20 in conventional manner. The first control grid 12 is connected through a grid dropping resistor 22 to ground. The first screen grid 16 is connected through a screen dropping resistor 23 to the positive side of a suitable source of operating potential (not shown). A conventional screen bypass capacitor 24 is connected between the screen grid 16 and ground. The suppressor grid 19 is connected to the cathode 15. The anode 14 is connected through a load resistor 25 to the positive side of the source. The anode 14 is also connected through a coupling capacitor 26 to one end of a parallel resonant circuit 27 comprising a capacitor 28 in parallel with a choke coil 29. The second side of the resonant circuit 27 is connected through an isolating resistor 30 to ground. The junction between the resonant circuit 27 and the isolating resistor 30 is connected to the second control grid 17 of the device 13.

The first side of the parallel resonant circuit 27 is connected to a control electrode 31 of an electron discharge device 32, shown as the first section of a double-triode type electron discharge device. Device 32 comprises an anode 33, a cathode 34, and the previously mentioned control electrode 31. The anode 33 is connected through a suitable load resistor 35 to the positive side of the source. The cathode 34 is connected through a conventional cathode resistor 36 to ground. The output of the device 32 is taken off the anode 33 with respect to ground through an output coupling condenser 37, and appears across the output terminals 38.

The second section of the double-triode electron discharge device is connected in a conventional cathode follower circuit and comprises a triode device 39 having an anode 40, a cathode 41 and a control grid 42. The cathode 41 is connected through a cathode resistor 43 in series with a cathode load resistor 44 to ground. The anode 40 is connected to the positive side of the source. The grid 42 is connected through a grid resistor 45 to the junction between resistors 43 and 44. The grid 42 is also connected to the junction between the resonant circuit 27 and isolating resistor 30 by means of the coupling capacitor 46. The output of the cathode follower circuit is derived from the cathode 41 by means of a coupling capacitor 47 and applied to the cathode 34 of the first section of the double-triode device.

In operation, an input signal wave to be filtered is applied to the control electrode 12 of device 13 by means of the input terminals 11 in conventional manner. Device 13 functions conventionally as an amplifier of the applied signal wave. The amplifier output wave is taken off the anode 14 with respect to ground and coupled by means of the capacitor 26 to the control electrode 31 of the second amplifier device 32. The grid-cathode circuit of device 32 contains the parallel resonant circuit 27 which is tuned to resonance at the frequency to be filtered. In accordance with well-known principles, the resonant circuit 27 thus offers a high impedance path to waves of its resonant frequency. Hence, those waves are applied in nearly their full intensity to the control electrode 31 of the device 32. Waves of all other frequencies, however, are offered a substantially lowered impedance path by the resonant circuit 27 and thus are readily transmitted through the resonant circuit 27 and develop a voltage across the isolating resistor 30. The voltage appearing across isolating resistor 30 is applied by means of the direct connection to the second control electrode 17 of the device 13 to provide a degenerative feedback voltage to the first amplifier stage. This voltage is a maximum for the non-resonant frequencies of the resonant circuit 27.

In addition to the degenerative feedback provided for device 13, a degenerative control voltage is also taken off across the isolating resistor 30 through the coupling capacitor 46 and applied to the control grid 42 of device 39, which is connected in a conventional cathode-follower circuit. The output of this circuit, derived across the cathode resistor 43, is coupled to the cathode 34 of the second device 32 in order to introduce a degenerative "feed-forward" voltage to the second stage of amplification. The purpose of the cathode-follower circuit is to provide an impedance matching circuit from the high impedance across resistor 30 to the comparatively lower impedance of the cathode circuit of device 32.

In addition to providing a frequency-selective degenerative voltage to both of the amplifier devices 13 and 32, the filter unit 27 in series with the isolating resistor 30 comprises a frequency-selective impedance path across the input circuit of the amplifier device 32, thus providing means for attenuating to a substantially larger extent a selected frequency portion of waves applied to the control grid 31 of the device 32.

A further feature of the invention is frequency-selective loading of the first amplifying stage due to the presence of the series circuit including the filter unit 27 and the isolating resistor 30 in parallel with the load impedance 25. Since, as is well-known, the load impedance directly affects the amplification factor of an amplifier stage, the effect of this loading of device 13 is to produce a degree of amplification which varies in accordance with the frequency-selective impedance offered by the filter unit 27.

Figure 2:
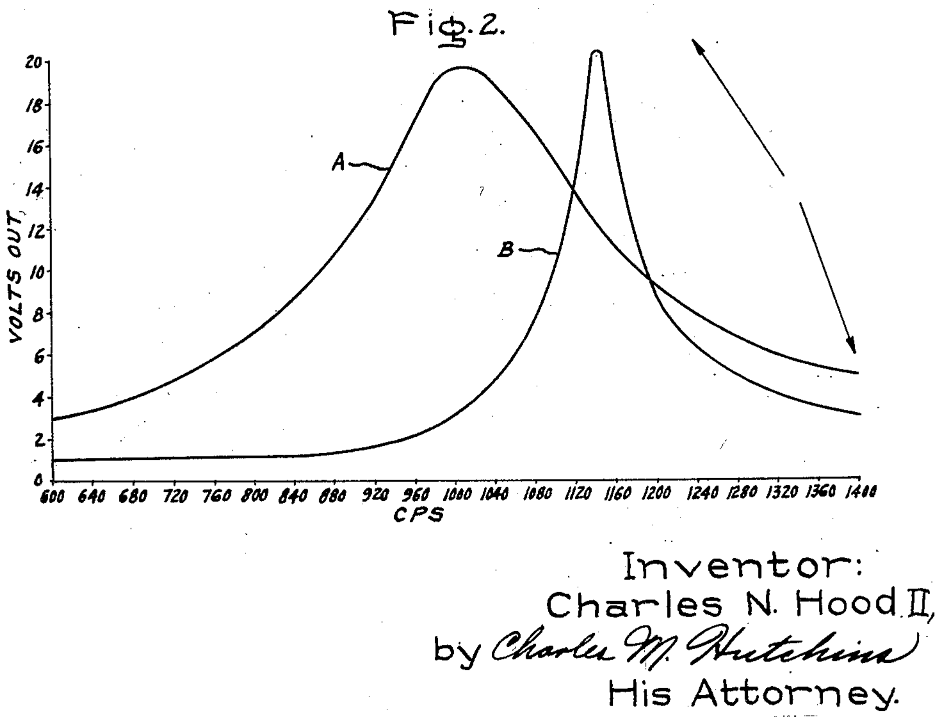
Fig. 2 is a graphic representation showing the comparative features of a parallel resonant filter unit when employed as a filter unit of the present device and when employed as the load impedance of a conventional amplifier device.

The advantages of the present invention may be advantageously considered by referring now to Fig. 2, which shows a pair of output curves illustrating the frequency-selective characteristics of two different circuits in response to similar signal waves comprising a plurality of frequency components. Curve A represents the output wave of a conventional amplifying stage having a conventional high-Q parallel resonant circuit included as its plate load impedance. Curve B represents the output wave of a filter device constructed in accordance with the principles of the present invention, in which the same conventional parallel resonant circuit is employed as the filter unit (designated 27 in Fig. 1).

In a preferred form of the invention, a sharp cutoff pentagrid tube may be employed for device 13. However, in other applications it may be found entirely satisfactory to employ a pentagrid tube or the like having other than sharp cutoff characteristics. The employment of a double-triode device for the second amplifier and the cathode follower circuit provides a simple and convenient arrangement, but does not necessarily represent an integral part of the invention.

Thus, it is believed apparent that the present invention discloses a convenient high-Q filter device in which a single parallel resonant circuit is employed to provide frequency-selective degenerative voltages for two successive stages of amplification, as well as frequency-selective loading of the first stage and frequency-selective attenuation in the input circuit of the second stage.

While a specific embodiment of the present invention has been shown and described, it will of course be understood that various modifications may be made without departing from the principles of the invention. The appended claims are therefore intended to cover any such modifications within the true spirit and scope of the invention.

What I claim as new and desire to secure by Letters Patent of the United States is:

1. A high-Q electronic filter comprising a first electron discharge device having a plurality of electrodes including an anode, a cathode, a first control electrode, and a second control electrode, a second electron discharge device having a plurality of electrodes including an anode, a cathode and a control electrode, means for applying operating potentials to the electrodes of each of said devices, a parallel-resonant filter unit having first and second terminals, means for applying a signal wave to said first control electrode of said first device, means for deriving an output wave from said anode of said first device, means for simultaneously applying said derived wave to said control electrode of said second device and to said first terminal of said filter unit, means for deriving a frequency-selective voltage from said second terminal of said filter unit, means for applying said frequency-selective voltage to said second control electrode of said first device and means for simultaneously applying said frequency-selective voltage to said cathode of said second device, thereby to provide a frequency-selective degenerative voltage to said first and second device.

2. A high-Q electronic filter comprising a first electron discharge device having a plurality of electrodes including an anode, a cathode, a first control electrode, and a second control electrode, a second electron discharge device having a plurality of electrodes including an anode, a cathode and a control electrode, means for applying operating potentials to the electrodes of each of said devices, a parallel-resonant filter unit having first and second terminals, means for applying a signal wave to said first control electrode of said first device, means for deriving an output wave from said anode of said first device, means for simultaneously applying said derived wave to said control electrode of said second device and to said first terminal of said filter unit, means including an impedance element connected between said second terminal and a common reference point of potential for deriving a frequency-selective voltage from said second terminal of said filter unit, means for applying said frequency-selective voltage to said second control electrode of said first device and means for simultaneously applying said frequency-selective voltage to said cathode of said second device, thereby to provide a frequency-selective degenerative voltage to said first and second devices.

3. A high-Q electronic filter comprising a first electron discharge device having a plurality of electrodes including an anode, a cathode, a first control electrode, and a second control electrode, a second electron discharge device having a plurality of electrodes including an anode, a cathode and a control electrode, means for applying operating potentials to the electrodes of each of said devices, a parallel resonant filter unit having first and second terminals, means for applying a signal wave to said first control electrode of said first device, means for deriving an output wave from said anode of said first device, means for simultaneously applying said derived wave to said control electrode of said second device and to said first terminal of said filter unit, means for deriving a frequency-selective voltage from said second terminal of said filter unit, means for applying said frequency-selective voltage to said second control electrode of said first device and means including a cathode follower circuit for simultaneously applying said frequency-selective voltage to said cathode of said second device, thereby to provide a frequency-selective degenerative voltage to said first and second devices.

4. A high-Q electronic filter comprising a first electron discharge device having a plurality of electrodes including an anode, a cathode, a first control electrode, and a second control electrode, a second electron discharge device having a plurality of electrodes including an anode, a cathode and a control electrode, means for applying operating potentials to the electrodes of each of said devices, a parallel resonant filter unit having first and second terminals, means for applying a signal wave to said first control electrode of said first device, means for deriving an output wave from said anode of said first device, means for simultaneously applying said derived wave to said control electrode of said second device and to said first terminal of said filter unit, means including an impedance element connected between said second terminal and a common reference point of potential for deriving a frequency-selective voltage from said second terminal of said filter unit, means for applying said frequency-selective voltage to said second control electrode of said first device and means including a cathode follower circuit for simultaneously applying said frequency-selective voltage to said cathode of said second device, thereby to provide a frequency-selective degenerative voltage to said first and second devices.

5. A high-Q electronic filter comprising a first electron discharge device including an anode, a cathode, a first control electrode, and a second control electrode, a second electron discharge device including an anode, a cathode and a control electrode, a third electron discharge device including an anode, a cathode, and a control electrode, means for applying operating potentials to the electrodes of each of said devices, a parallel resonant filter unit having first and second terminals, means for applying a signal wave to said first control electrode of said first device, means for deriving an output wave from said anode of said first device, means for simultaneously applying said derived wave to said control electrode of said second device and to said first terminal of said filter unit, means including an impedance element connected between said second terminal and a common reference point of potential for deriving a frequency-selective voltage from said second terminal of said filter unit, means for applying said frequency-selective voltage to said second control electrode of said first device, means for simultaneously applying said frequency-selective voltage to said control electrode of said third device, means for deriving an output voltage from said cathode of said third device, and means for applying the output derived from said third cathode to the cathode of said second device, thereby to provide a frequency-selective-degenerative voltage to said first and second devices.

6. A high-Q electronic filter comprising a first electron discharge device including an anode, a cathode, a first control electrode, and a second control electrode, a second electron discharge device including an anode, a cathode and a control electrode, a third electron discharge device including an anode, a cathode, and a control electrode, means for applying operating potentials to the electrodes of each of said devices, a parallel resonant circuit having first and second terminals, an impedance element connected between said second terminal and a common reference point of potential, means for applying a signal wave to said first control electrode of said first device, means for deriving an output wave from said anode of said first device, means for simultaneously applying said derived wave to said control electrode of said second device and to said first terminal of said resonant circuit, means including said impedance element for deriving a frequency-selective voltage from said second terminal of said filter unit, means for applying said frequency-selective voltage to said second control electrode of said first device and a cathode follower circuit including said third device for simultaneously applying said frequency-selective voltage to said cathode of said second device, thereby to provide a frequency-selective degenerative voltage to said first and second devices.

7. A high-Q electronic filter comprising a first electron discharge device including an anode, a cathode, a first control electrode, and a second control electrode, a second electron discharge device including an anode, a cathode and a control electrode, a third electron discharge device including an anode, a cathode, and a control electrode, means for applying suitable operating potentials to each of said devices, a parallel-resonant filter unit tunable to a selected frequency and having first and second terminals, means for applying a signal wave to said first control electrode of said first device, means for deriving an output wave from said anode of said first device, means for simultaneously applying said derived wave to said control electrode of said second device and to said first terminal of said filter unit, means including a resistance element connected between said second terminal and a common reference point of potential for deriving a frequency-selective voltage from said second terminal of said filter unit, means for applying said frequency-selective voltage to said second control electrode of said first device, means for simultaneously applying said frequency-selective voltage to said control electrode of said third device, means for deriving an output voltage from said cathode of said third device, means for applying the output derived from said third cathode to the cathode of said second device, thereby to provide a frequency-selective degenerative voltage to said first and second devices.

References Cited in the file of this patent

UNITED STATES PATENTS

| | | |
|---|---|---|
| 1,869,331 | Ballantine | July 26, 1932 |
| 1,976,457 | Ohl | Oct. 9, 1934 |
| 2,261,430 | Andrews | Nov. 4, 1941 |
| 2,351,934 | Kramolin | June 20, 1944 |
| 2,359,504 | Baldwin | Oct. 3, 1944 |

OTHER REFERENCES

Terman text, "Radio Engineering," 3d ed. pages 319–323, pub. 1947 by McGraw-Hill Book Co., N. Y.